United States Patent [19]

Iyer

[11] Patent Number: 6,001,541
[45] Date of Patent: Dec. 14, 1999

[54] METHOD OF FORMING CONTACT OPENINGS AND CONTACTS

[75] Inventor: Ravi Iyer, Boise, Id.

[73] Assignee: Micron Technology, Inc., Boise, Id.

[21] Appl. No.: 09/049,970

[22] Filed: Mar. 27, 1998

[51] Int. Cl.[6] ................................................ H01L 21/00
[52] U.S. Cl. .............................. 430/322; 216/67; 216/79; 216/99; 216/109; 438/636; 438/637; 438/672; 438/724; 438/743; 438/744
[58] Field of Search ..................................... 438/636, 637, 438/672, 724, 743, 744; 216/67, 79, 99, 109; 430/373, 316, 317, 322

[56] References Cited

U.S. PATENT DOCUMENTS

| | | | |
|---|---|---|---|
| 5,320,979 | 6/1994 | Hashimoto et al. | 437/192 |
| 5,371,042 | 12/1994 | Ong | 437/194 |
| 5,496,773 | 3/1996 | Rhodes et al. | 437/189 |
| 5,580,821 | 12/1996 | Mathews et al. | 437/187 |
| 5,883,011 | 3/1999 | Lin et al. | 438/747 |

OTHER PUBLICATIONS

U.S. application No. 08/916,276, Iyer et al., filed Aug. 1997.

*Primary Examiner*—Thorl Chea
*Attorney, Agent, or Firm*—Wells, St. John, Roberts, Gregory & Matkin P.S.

[57] ABSTRACT

The invention comprises methods of forming contact openings and methods of forming contacts. In but one implementation, an inorganic antireflective coating material layer is formed over an insulating material layer. A contact opening is etched through the inorganic antireflective coating layer and into the insulating layer. Insulative material within the contact opening is etched and a projection of inorganic antireflective coating material is formed within the contact opening. The inorganic antireflective coating material is etched to substantially remove the projection from the contact opening. The preferred etching to remove the projection is facet etching, most preferably plasma etching. The preferred inorganic antireflective coating material is selected from the group consisting of $SiO_x$ where "x" ranges from 0.1 to 1.8, $SiN_y$ where "y" ranges from 0.1 to 1.2, and $SiO_xN_y$ where "x" ranges from 0.2 to 1.8 and "y" ranges from 0.01 to 1.0, and mixtures thereof. In another implementation, only a portion of the inorganic antireflective coating layer is removed from over the insulating material layer after initially etching the contact opening. After removing the portion of the inorganic antireflective coating layer, the insulating material layer is etched to widen at least a portion of the contact opening. The invention also contemplates use of organic antireflective coating layers.

38 Claims, 4 Drawing Sheets

METHOD OF FORMING CONTACT OPENINGS AND CONTACTS

TECHNICAL FIELD

This invention relates to a method of forming contact openings and contacts.

BACKGROUND OF THE INVENTION

One process utilized in the fabrication of semiconductor integrated circuits is photolithography. Such typically involves reproducing an image from an optical mask in a layer of photoresist that is supported by underlying layers of a semiconductive substrate. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. The ability to reproduce precise images in a layer of photoresist is crucial to meeting demands for increasing device density.

In a typical photolithographic process, an optical mask is first positioned between a radiation source and a photoresist layer received over underlying layers. The image from the mask is reproduced in the photoresist by exposing the photoresist to radiation from the radiation source through the optical mask. Portions of the mask are opaque and prevent exposure of the underlying photoresist to the radiation. Other portions of the mask are transparent to the radiation, allowing exposure of the underlying photoresist.

The layers underlying the photoresist include one or more individual layers that are to be selectively removed relative to surrounding layers to achieve desired patterning. Depending on the type of photoresist utilized (i.e., positive type or negative type), exposed photoresist is either removed when the substrate is contacted with a developer solution, or the exposed photoresist becomes more resistant to dissolution in the developer solution. In either event, a patterned photoresist layer is formed over underlying layers which can be used as an etching mask in subsequent etching.

One problem experienced with conventional optical photolithography is difficulty in obtaining uniform exposure of photoresist underlying transparent portions of the mask. It is typically desired that the light intensity exposing the photoresist be uniform to obtain optimum results. When sufficiently thick layers of photoresist are used, the photoresist is or becomes partially transparent so that the photoresist where it meets with underlying layers is exposed to a substantially similar extent as the outermost surface of the photoresist. Often, however, light that penetrates the photoresist is reflected back towards the light source from the surface of the underlying layers over which the photoresist is received. The angle at which the light is reflected is dependent on the topography of the surface of the underlying layers and the type of material of the underlying layers. The reflected light intensity can vary in the photoresist throughout its depth or partially through its depth, leading to non-uniform exposure and possible undesirable exposure of adjacent photoresist. Such exposure of photoresist can lead to poorly controlled defined features of the integrated circuit.

In an attempt to minimize the variable reflection of light in a photoresist layer, antireflective coatings have been utilized between the underlying layers and the photoresist layer, or even between the photoresist layer and the radiation source. Antireflective coatings minimize photoresist exposure from surface reflections, allowing the exposure across a photoresist layer to be controlled more easily than the radiation incident on the photoresist from the radiation source.

Antireflective coatings are typically organic materials. Organic layers can, however, lead to particle or other contamination in the integrated circuit due to possible incomplete removal of such organic material from the underlying layers after the photolithography set is performed. Such contamination can, of course, be detrimental to electrical performance of the integrated circuit. Further, the underlying layers upon which the organic materials are formed may be uneven resulting in different thicknesses of the organic material used as the antireflective coating (e.g., thicker regions of the organic material may be present at various locations of the underlying layers). As such when attempting to remove such organic material, if the etch is stopped when the underlying layers are reached, then some organic material may be left. If the etch is allowed to progress to etch the additional thickness in such regions or locations, then the underlying layers may be undesirably etched (e.g., punch-through of an underlying layer can occur).

SUMMARY OF THE INVENTION

The invention comprises methods of forming contact openings and methods of forming contacts. In but one implementation, an inorganic antireflective coating material layer is formed over an insulating material layer. A contact opening is etched through the inorganic antireflective coating layer and into the insulating layer. Insulative material within the contact opening is etched and a projection of inorganic antireflective coating material is formed within the contact opening. The inorganic antireflective coating material is etched to substantially remove the projection from the contact opening. The preferred etching to remove the projection is facet etching, most preferably plasma facet etching. The preferred inorganic antireflective coating material is selected from the group consisting of $SiO_x$ where "x" ranges from 0.1 to 1.8, $SiN_y$ where "y" ranges from 0.1 to 1.2, and $SiO_xN_y$ where "x" ranges from 0.2 to 1.8 and "y" ranges from 0.01 to 1.0, and mixtures thereof.

In another implementation, only a portion of the inorganic antireflective coating layer is removed from over the insulating material layer after initially etching the contact opening. After removing the portion of the inorganic antireflective coating layer, the insulating material layer is etched to widen at least a portion of the contact opening.

The invention also contemplates use of organic antireflective coating layers.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
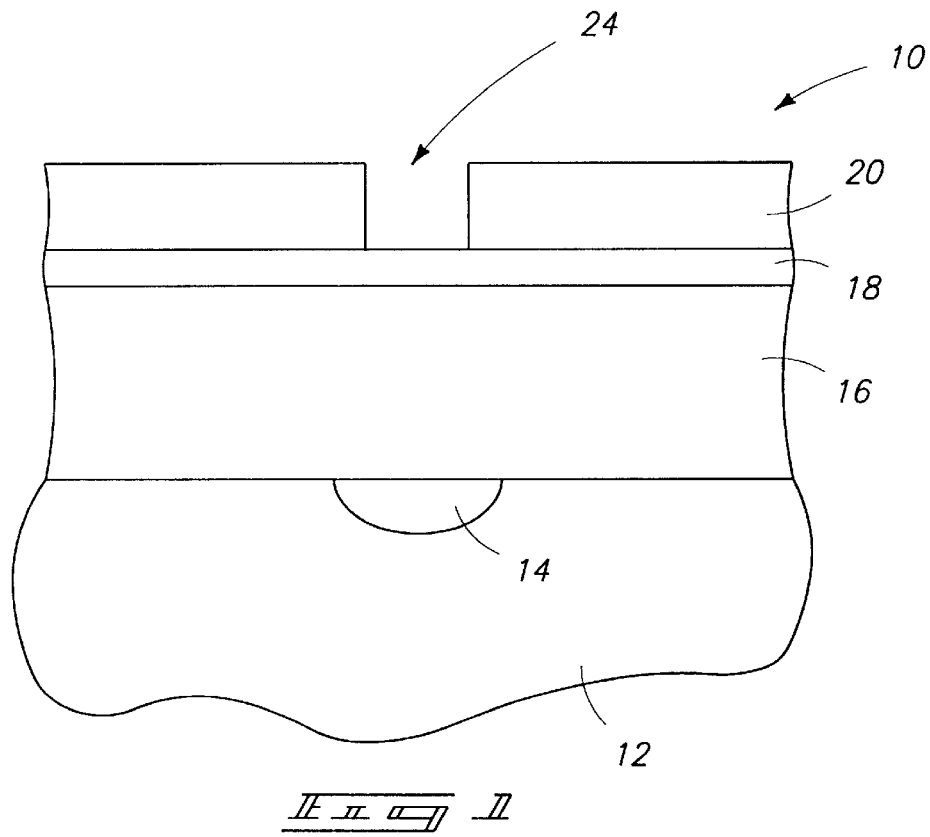
FIG. 1 is a diagrammatic sectional view of a semiconductor wafer fragment at one processing step in accordance with the invention.

Referring to FIG. 1, a semiconductor wafer fragment in process is indicated generally with reference numeral 10. Such comprises a bulk monocrystalline silicon substrate 12 having a diffusion region 14 provided therein. An insulating material layer 16 is provided over silicon substrate 12. An exemplary and preferred material is an oxide material, such as borophosphosilicate glass. An exemplary thickness for layer 16 is from about 10,000 Angstroms to about 30,000 Angstroms. An antireflective coating material layer 18 is provided over insulating material layer 16. An exemplary thickness is from about 100 Angstroms to about 500 Angstroms. Most preferably, such layer comprises an inorganic antireflective coating material. Examples includes $SiO_x$ where "x" ranges from 0.1 to 1.8; $SiN_y$ where "y" ranges from 0.1 to 1.2; and $SiO_xN_y$ were "x" ranges from 0.2 to 1.8, and "y" ranges from 0.01 to 1.0; and mixtures thereof. Thus in the preferred embodiment, both the insulating material of layer 16 and the antireflective coating material of layer 16 comprise oxide material. Examples of producing inorganic antireflective coating layers are disclosed in U.S. patent application Ser. No. 08/916,276, filed on Aug. 22, 1997, entitled "Isolation Using An Antireflective Coating", listing inventors as Ravi Iyer, Steve McDonald, Tom Glass and Zhiping Yin, which is hereby incorporated by reference. A layer 20 of photoresist is formed over antireflective coating layer 18. Subsequently, such is patterned to provide the exemplary patterned opening 24 therein.

Figure 2:
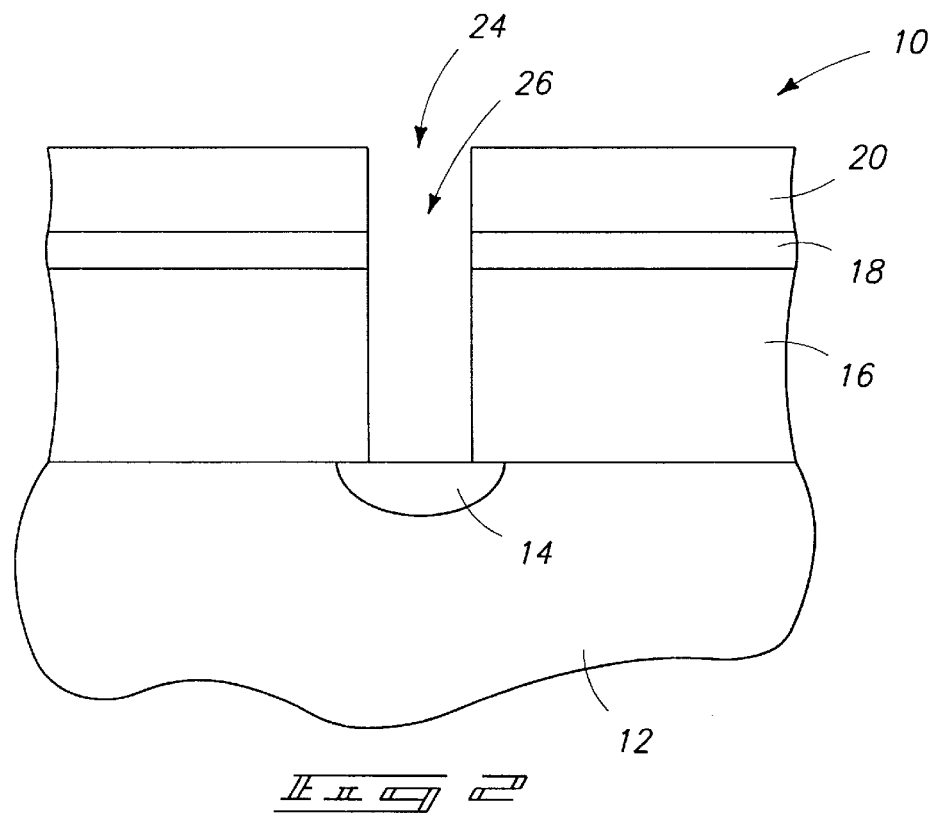
FIG. 2 is a view of the FIG. 1 wafer at a processing step subsequent to that depicted by FIG. 1.

Referring to FIG. 2, a contact opening 26 is etched through antireflective coating layer 18, and into and through insulating layer 16 to expose silicon of substrate 12. Alternate substrates from a monocrystalline silicon substrate 12 might be utilized. Regardless, most preferably the substrate exposed by the contact etch comprises silicon, alternately for example polysilicon of a thin film transistor layer. Masked portions of antireflective coating layer 18 and insulating material layer 16 are substantially prevented from being etched during such etching. An exemplary etch chemistry for producing the illustrated anisotropic contact etching for the above preferred materials includes a combination of $CHF_3$, $CF_4$ and $C_2HF_5$.

Figure 3:
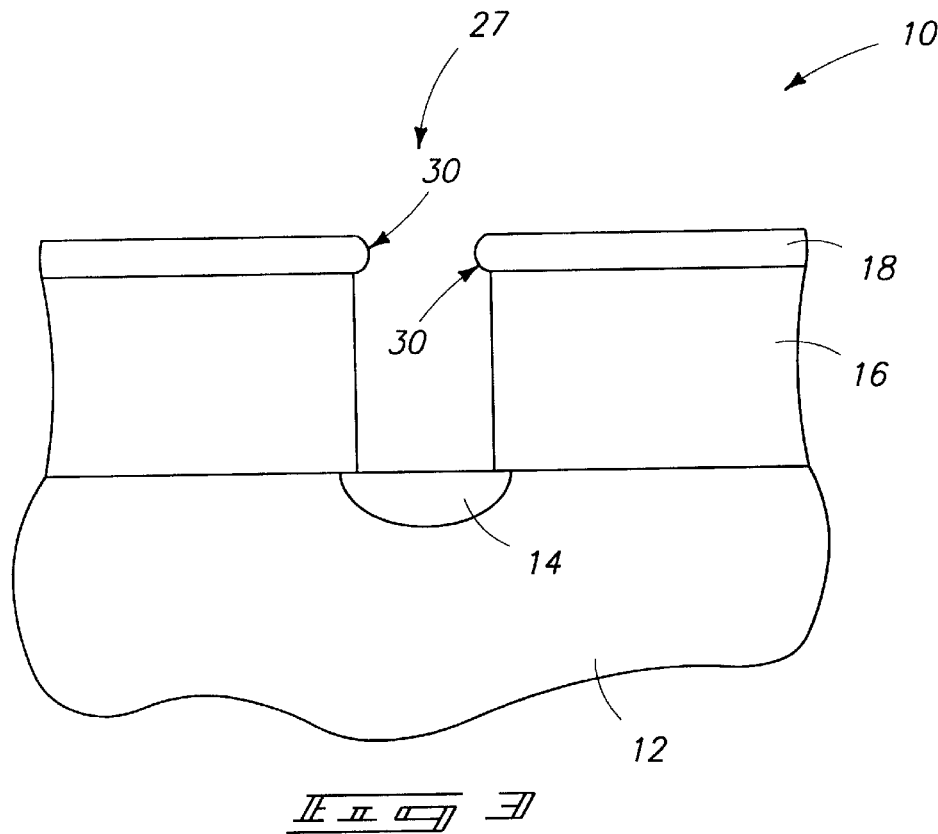
FIG. 3 is a view of the FIG. 1 wafer at a processing step subsequent to that depicted by FIG. 2.

Referring to FIG. 3, photoresist layer 20 (not shown) has been stripped from the substrate substantially selectively relative to antireflective coating layer 18. Where antireflective coating layer 18 comprises an inorganic material, example stripping chemistries/techniques for photoresist include piranha solutions ($H_2SO_4$ and $HNO_3$), a dry oxygen plasma strip and a combination of these two. A tenacious native oxide (not shown) typically forms over or on the silicon of substrate material 12 during all the above processing. It is highly desirable to remove this native oxide prior to subsequent processing to achieve a good conductive contact at the base of the contact opening. An exemplary process for achieving such in accordance with the prior art and in accordance with the invention constitutes wet etching, for example using an etching solution comprising HF or a combination of HF and tetramethyl ammonium hydroxide. An example etching solution includes 1 part HF to 6 parts tetramethyl ammonium hydroxide within 100 parts of water, by volume. Example conditions for such an etch include a temperature of 25° C., atmospheric pressure, and a time of etch anywhere from 30 to 300 seconds.

Such is intended to remove an oxide formed (i.e., if any has formed) on exposed silicon material of substrate 12 within contact opening 26. Unfortunately, such wet etching typically removes the oxide of insulative material layer 16 at a faster rate than any etching which occurs of inorganic antireflective coating material layer 18 within contact opening 26. The result, as shown in FIGS. 3, is an effective widening of contact opening 26 (from FIG. 2) to a wider contact opening 27. This forms projections 30 of the inorganic antireflective coating material of layer 18 within the resultant contact opening 26/27.

Where the underlying antireflective coating layer comprises an organic material, the projection formation typically does not occur as the conventional stripping chemistry utilized to strip photoresist will also strip the organic antireflective coating material thereunder. Where conventional organic photoresist strippers are utilized over inorganic antireflective coating material layers, and particularly where the inorganic coating material layer comprises an oxide other than borophosphosilicate glass, the FIG. 3 effect typically results due to the greater etch rate of borophosphosilicate glass to other oxides, particularly in an HF and tetramethyl ammonium hydroxide wet etch. Projections 30 relative to contact opening 27 can undesirably result in keyhole formation in subsequently deposited conductive material within contact opening 27. A more desired goal is to achieve essential complete filling of contact opening 27 with conductive material, with there being essentially no keyhole or other voids therein.

Figure 4:
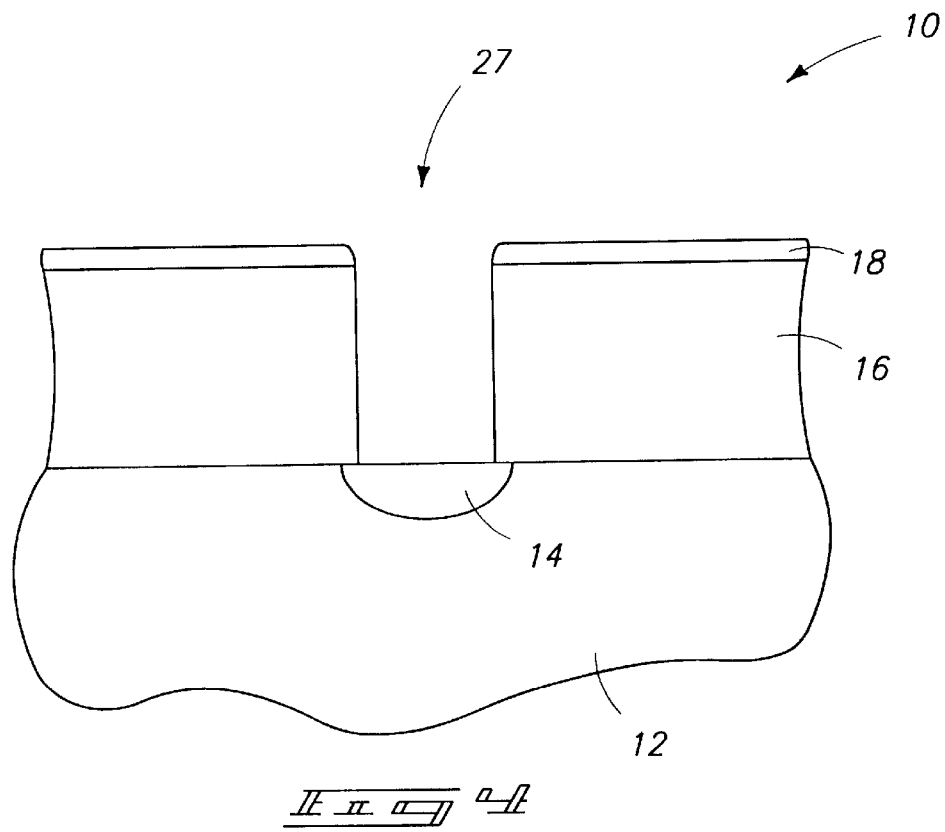
FIG. 4 is a view of the FIG. 1 wafer at a processing step subsequent to that depicted by FIG. 3.

Referring to FIG. 4, antireflective coating material 18 is etched to substantially remove projections 30 from within contact opening 27 and to preferably achieve a more linear profile for the sidewalls of contact opening 27. A preferred process comprises facet etching, and particularly dry facet etching in a magnetically enhanced plasma etcher, such as an Applied Materials 5000 etcher. A specific example is a flow of Ar at from 10 sccm to 200 sccm, RF power at from 100 to 800 Watts, pressure at from 5 mTorr to 50 mTorr, the temperature of the wafer being allowed to float, and a magnetic field at from 10 Gauss to 100 Gauss for an eight inch wafer. An example time is from 15 seconds to 60 seconds. Such a facet etch will also typically etch away approximately one half the thickness of layer 18.

Figure 5:
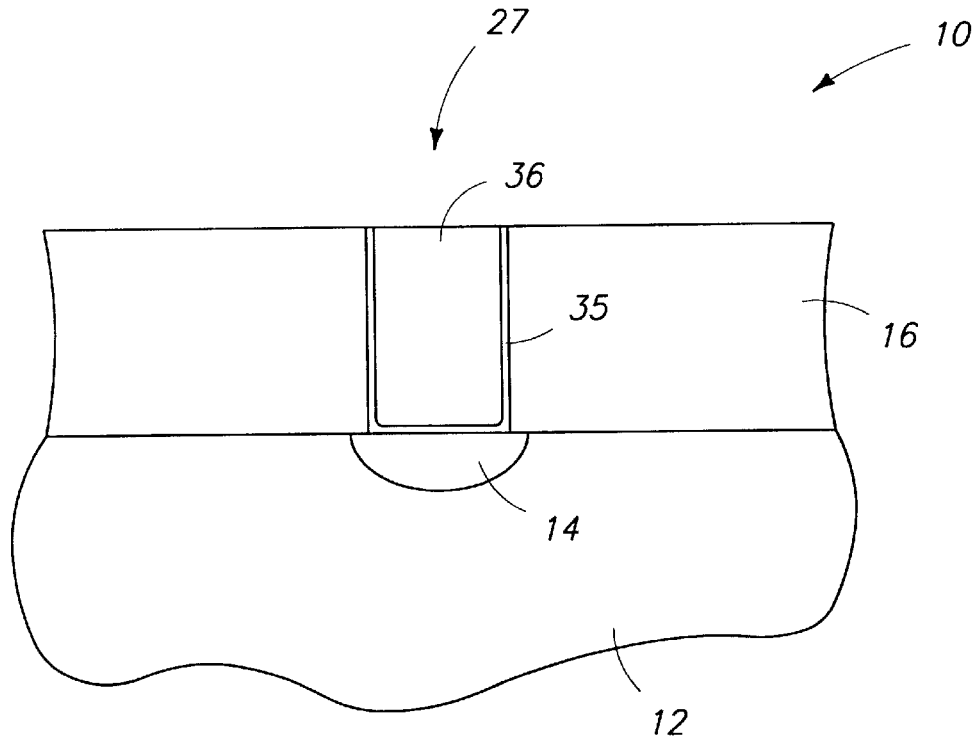
FIG. 5 is a view of the FIG. 1 wafer at a processing step subsequent to that depicted by FIG. 4.

FIG. 5 illustrates subsequent contact opening 27 filling with an exemplary titanium or titanium nitride barrier layer 35, followed by subsequent filling with a tungsten-plugging material 36. Layer 18 can remain in the process, or it can be removed in the process as is shown, such as by chemical etching or chemical-mechanical polishing.

Figure 6:
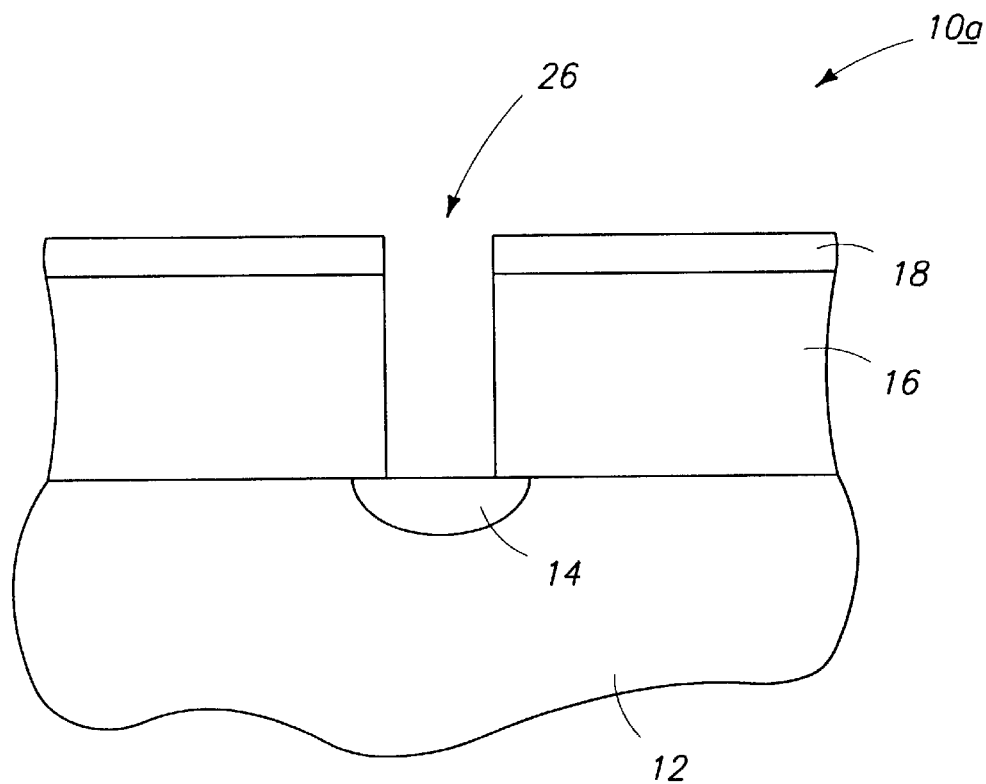
FIG. 6 is a diagrammatic sectional view of an alternate embodiment semiconductor wafer fragment at one processing step in accordance with the invention.
Figure 7:
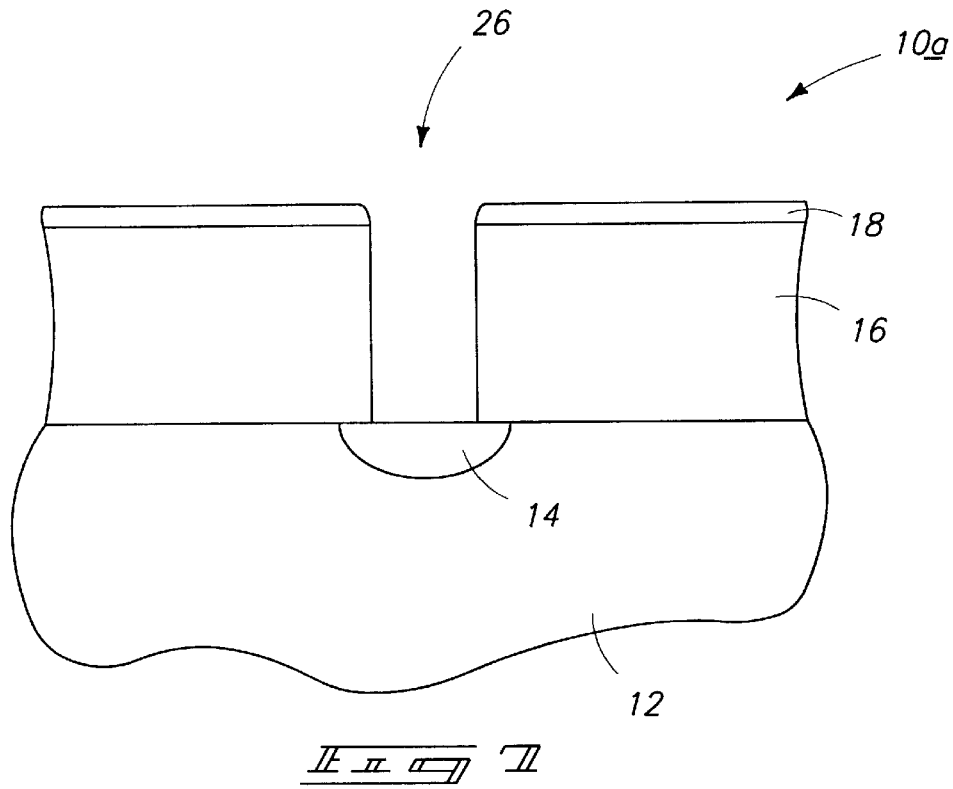
FIG. 7 is a view of the FIG. 6 wafer at a processing step subsequent to that depicted by FIG. 6
Figure 8:
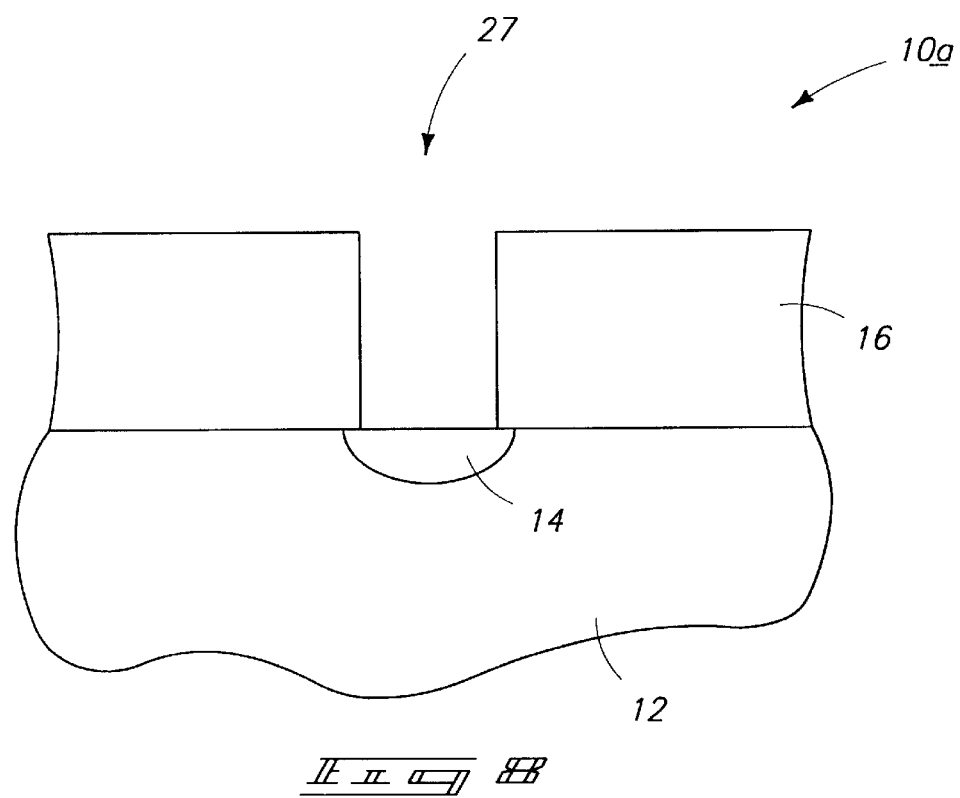
FIG. 8 is a view of the FIG. 6 wafer at a processing step subsequent to that depicted by FIG. 7.

An alternate embodiment is described with reference to FIGS. 6–8, which depict a wafer fragment 10a. Like numerals from the first described embodiment have been utilized where appropriate, with differences being indicated with the suffix "a". FIG. 6 illustrates processing occurring just after FIG. 2. Specifically, the photoresist from FIG. 2 has been stripped. Only a portion of layer 18 is then removed from over insulating material layer 16 (FIG. 7), preferably by the facet etching referred to above. Referring to FIG. 8, insulating material layer 16 is then subjected to etching to widen at least a portion of contact opening 26 (FIG. 7) to a wider contact opening 27 (FIG. 8). The preferred etching is the wet etching referred to above. Such wet etching, in part because of the reduced thickness of layer 18, preferably collectively widens the contact opening, removes any oxide from over diffusion region 14 and etches all the inorganic antireflective coating layer from over the insulating material layer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a contact opening comprising:
   providing a substrate;
   forming an insulating material layer over the substrate;
   forming an inorganic antireflective coating material layer over the insulating material layer;
   etching a contact opening through the inorganic antireflective coating layer and into the insulating layer;
   laterally etching insulative material within the contact opening and forming a projection of inorganic antireflective coating material within the contact opening; and
   etching the inorganic antireflective coating material to substantially remove the projection from the contact opening.

2. The method of claim 1 further comprising in a step subsequently discrete from the etching of the inorganic antireflective coating material to substantially remove the projection from the contact opening, removing the inorganic antireflective coating layer from over the insulating material layer.

3. The method of claim 1 wherein the contact etching and the insulative material etching comprise at least two etching steps.

4. The method of claim 1 wherein the contact etching and the insulative material etching comprise two or less etching steps.

5. The method of claim 1 wherein the contact etching and the insulative material etching constitute two etching steps.

6. The method of claim 1 wherein the etching to remove the projection comprises facet etching in a plasma etcher.

7. The method of claim 1 wherein the inorganic antireflective coating material is selected from the group consisting of $SiO_x$ where "x" ranges from 0.1 to 1.8, $SiN_y$ where "y" ranges from 0.1 to 1.2, and $SiO_xN_y$ where "x" ranges from 0.2 to 1.8 and "y" ranges from 0.01 to 1.0, and mixtures thereof.

8. The method of claim 1 wherein the insulating material comprises borophosphosilicate glass.

9. The method of claim 1 wherein both the insulating material and the inorganic antireflective coating material comprise oxide material.

10. The method of claim 1 wherein the insulating material comprises borophosphosilicate glass; and
    the inorganic antireflective coating material is selected from the group consisting of $SiO_x$ where "x" ranges from 0.1 to 1.8, $SiN_y$ where "y" ranges from 0.1 to 1.2, and $SiO_xN_y$ where "x" ranges from 0.2 to 1.8 and "y" ranges from 0.01 to 1.0, and mixtures thereof.

11. A method of forming a contact opening comprising:
    providing a silicon comprising substrate;
    forming an insulating oxide material layer over the substrate and an inorganic antireflective coating material layer over the oxide material layer;
    etching a contact opening through the inorganic antireflective coating layer and through the insulating layer to expose silicon of the substrate;
    wet etching within the contact opening to remove any oxide formed on the exposed silicon within the contact opening, the wet etching laterally removing oxide insulative material within the contact opening at a faster rate than any etching of the inorganic antireflective coating material within the contact opening and forming a projection of inorganic antireflective coating material within the contact opening; and
    etching the inorganic antireflective coating material to substantially remove the projection from the contact opening.

12. The method of claim 11 wherein the wet etching comprises etching with a solution having HF therein.

13. The method of claim 11 wherein the wet etching comprises etching with a solution having HF and tetramethyl ammonium hydroxide therein.

14. The method of claim 11 wherein both the insulating material and the antireflective coating material comprise oxide material.

15. The method of claim 11 wherein the etching to remove the projection comprises facet etching in a plasma etcher.

16. The method of claim 11 wherein the inorganic antireflective coating material is selected from the group consisting of $SiO_x$ where "x" ranges from 0.1 to 1.8, $SiN_y$ where "y" ranges from 0.1 to 1.2, and $SiO_xN_y$ where "x" ranges from 0.2 to 1.8 and "y" ranges from 0.01 to 1.0, and mixtures thereof.

17. A method of forming a contact opening comprising:
    providing a substrate;
    forming an insulating material layer over the substrate;
    forming an antireflective coating material layer over the insulating material layer;
    forming a patterned photoresist layer over the antireflective coating layer;
    using the photoresist layer, etching a contact opening through the antireflective coating layer and into the insulating layer;
    stripping the photoresist layer substantially selective relative to the antireflective coating layer;
    after stripping the photoresist, etching insulative material within the contact opening laterally and forming a projection of antireflective coating material within the contact opening; and
    etching the antireflective coating material to substantially remove the projection from the contact opening.

18. The method of claim 17 wherein the antireflective coating material is inorganic.

19. The method of claim 17 wherein the etching to remove the projection comprises facet etching in a plasma etcher.

20. The method of claim 17 wherein the antireflective coating is inorganic and selected from the group consisting of $SiO_x$ where "x" ranges from 0.1 to 1.8, $SiN_y$ where "y" ranges from 0.1 to 1.2, and $SiO_xN_y$ where "x" ranges from 0.2 to 1.8 and "y" ranges from 0.01 to 1.0, and mixtures thereof.

21. The method of claim 17 wherein the insulating material comprises borophosphosilicate glass.

22. The method of claim 17 wherein both the insulating material and the antireflective coating material comprise oxide material.

23. The method of claim 17 wherein the antireflective coating is inorganic, and both the insulating material and the inorganic antireflective coating material comprise oxide material.

24. The method of claim 17 wherein the insulating material comprises borophosphosilicate glass; and the antireflective coating material is inorganic and selected from the group consisting of $SiO_x$ where "x" ranges from 0.1 to 1.8, $SiN_y$ where "y" ranges from 0.1 to 1.2, and $SiO_xN_y$ where "x" ranges from 0.2 to 1.8 and "y" ranges from 0.01 to 1.0, and mixtures thereof.

25. A contact forming method comprising:

providing a silicon comprising substrate;

forming an insulating oxide material layer over the substrate and an inorganic antireflective coating material layer over the oxide material layer, the inorganic antireflective coating material being selected from the group consisting of $SiO_x$ where "x" ranges from 0.1 to 1.8, $SiN_y$ where "y" ranges from 0.1 to 1.2, and $SiO_xN_y$ where "x" ranges from 0.2 to 1.8 and "y" ranges from 0.01 to 1.0, and mixtures thereof;

forming a patterned photoresist layer over the inorganic antireflective coating layer;

using the photoresist layer, etching a contact opening through the inorganic antireflective coating layer and through the insulating layer to expose silicon of the substrate;

stripping the photoresist layer substantially selective relative to the inorganic antireflective coating layer;

after stripping, wet etching within the contact opening using an etching solution comprising HF to remove any oxide formed on the exposed silicon within the contact opening, the wet etching removing oxide insulative material laterally within the contact opening at a faster rate than any etching of the inorganic antireflective coating material within the contact opening and forming a projection of inorganic antireflective coating material within the contact opening;

facet etching the inorganic antireflective coating material in a magnetically enhanced plasma etcher to substantially remove the projection from the contact opening; and after the facet etching, forming conductive material within the contact opening.

26. The method of claim 25 wherein the wet etching solution comprises tetramethyl ammonium hydroxide.

27. A method of forming a contact opening comprising:

providing a substrate;

forming an insulating material layer over the substrate;

forming an inorganic antireflective coating material layer over the insulating material layer;

etching a contact opening through the inorganic antireflective coating layer and into the insulating layer;

after etching the contact opening, removing only a portion of the inorganic antireflective coating layer from over the insulating material layer; and after removing the portion of the inorganic antireflective coating layer, etching the insulating material layer to widen at least a portion of the contact opening.

28. The method of claim 27 further comprising in a step subsequently discrete from the removing of the portion of the inorganic antireflective coating layer, removing the inorganic antireflective coating layer from over the insulating material layer.

29. The method of claim 28 wherein said removing of the inorganic antireflective coating layer from over the insulating material layer and said etching of the insulating material layer to widen at least a portion of the contact opening occur in a common etching step.

30. The method of claim 27 wherein the removing of only a portion of the inorganic antireflective coating layer comprises facet etching in a plasma etcher.

31. A method of forming a contact opening comprising:

providing a silicon comprising substrate;

forming an insulating oxide material layer over the substrate and an inorganic antireflective coating material layer over the oxide material layer;

etching a contact opening through the inorganic antireflective coating layer and through the insulating layer to expose silicon of the substrate;

after etching the contact opening, removing only a portion of the inorganic antireflective coating layer from over the insulating material layer; and after removing the portion of the inorganic antireflective coating layer, wet etching within the contact opening to remove any oxide formed on the exposed silicon within the contact opening, the wet etching removing oxide insulative material within the contact opening at a faster rate than any etching of the inorganic antireflective coating material within the contact opening to widen at least a portion of the contact opening.

32. The method of claim 31 further comprising in a step subsequently discrete from the removing of the portion of the inorganic antireflective coating layer, removing the inorganic antireflective coating layer from over the insulating material layer.

33. The method of claim 32 wherein said removing of the inorganic antireflective coating layer from over the insulating material layer occurs during the wet etching.

34. The method of claim 31 wherein the removing of only a portion of the inorganic antireflective coating layer comprises facet etching in a plasma etcher.

35. A method of forming a contact opening comprising:

providing a substrate;

forming an insulating material layer over the substrate;

forming an antireflective coating material layer over the insulating material layer;

forming a patterned photoresist layer over the antireflective coating layer;

using the photoresist layer, etching a contact opening through the antireflective coating layer and into the insulating layer;

stripping the photoresist layer substantially selective relative to the antireflective coating layer;

after stripping the photoresist layer, removing only a portion of the antireflective coating layer from over the insulating material layer; and after removing the portion of the antireflective coating layer, etching the insulating material layer to widen at least a portion of the contact opening.

36. The method of claim 35 further comprising in a step subsequently discrete from the removing of the portion of the antireflective coating layer, removing the antireflective coating layer from over the insulating material layer.

37. The method of claim 36 wherein said removing of the antireflective coating layer from over the insulating material layer and said etching of the insulating material layer to widen at least a portion of the contact opening occur in a common etching step.

38. The method of claim 35 wherein the removing of only a portion of the antireflective coating layer comprises facet etching in a plasma etcher.

* * * * *